(12) United States Patent
Hill

(10) Patent No.: US 7,532,330 B2
(45) Date of Patent: May 12, 2009

(54) ANGLE INTERFEROMETERS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 224 days.

(21) Appl. No.: 11/504,455

(22) Filed: Aug. 15, 2006

(65) Prior Publication Data

US 2007/0064240 A1  Mar. 22, 2007

Related U.S. Application Data

(60) Provisional application No. 60/708,736, filed on Aug. 16, 2005.

(51) Int. Cl.
*G01B 9/02* (2006.01)

(52) U.S. Cl. ..................................... 356/493

(58) Field of Classification Search ......... 356/491–493, 356/497, 508–510, 487; 385/11; 372/72
See application file for complete search history.

(56) References Cited

U.S. PATENT DOCUMENTS

| | | | | | |
|---|---|---|---|---|---|
| 4,887,899 | A | * | 12/1989 | Hung | 356/35.5 |
| 5,187,543 | A | * | 2/1993 | Ebert | 356/487 |
| 5,220,397 | A | * | 6/1993 | Huang et al. | 356/140 |
| 5,305,088 | A | * | 4/1994 | Hosoe | 356/487 |
| 5,483,346 | A | * | 1/1996 | Butzer | 356/369 |
| 5,917,844 | A | * | 6/1999 | Hill | 372/27 |
| 5,970,077 | A | * | 10/1999 | Hill | 372/23 |
| 6,219,144 | B1 | | 4/2001 | Hill et al. | |
| 6,236,507 | B1 | * | 5/2001 | Hill et al. | 359/494 |
| 6,252,667 | B1 | * | 6/2001 | Hill et al. | 356/487 |
| 6,271,923 | B1 | * | 8/2001 | Hill | 356/487 |
| 6,313,918 | B1 | * | 11/2001 | Hill et al. | 356/498 |
| 6,327,039 | B1 | | 12/2001 | de Groot et al. | |
| 6,509,971 | B2 | * | 1/2003 | Inoue et al. | 356/487 |
| 6,541,759 | B1 | * | 4/2003 | Hill | 250/227.27 |
| 6,563,593 | B2 | * | 5/2003 | Hill | 356/510 |
| 6,628,376 | B1 | * | 9/2003 | Nikitin et al. | 356/38 |
| 6,707,558 | B2 | * | 3/2004 | Bennett | 356/483 |
| 6,727,992 | B2 | * | 4/2004 | Hill | 356/492 |
| 6,778,280 | B2 | * | 8/2004 | De Groot et al. | 356/493 |
| 6,791,693 | B2 | | 9/2004 | Hill | |
| 6,847,452 | B2 | | 1/2005 | Hill | |
| 6,856,402 | B2 | | 2/2005 | Hill | |
| 6,912,054 | B2 | | 6/2005 | Hill | |

(Continued)

OTHER PUBLICATIONS

Azzam, "Phase shifts that accompany total internal reflection at a dielectri-dielectric interface," Aug. 2004, Journal of the Optical Society of America, vol. 21, No. 8, pp. 1559-1563.*

Azzam, "Differential reflection phase shift under conditions of attenuated internal reflection," Jul. 1999, Journal of the Optical Society of America, vol. 16, No. 7, pp. 1700-1702.*

(Continued)

*Primary Examiner*—Patrick J Connolly
*Assistant Examiner*—Scott M Richey
(74) *Attorney, Agent, or Firm*—Fish & Richardson P.C.

(57) ABSTRACT

Methods and systems for determining information about the incident angle of a beam are disclosed, the method including directing a beam having an s-polarized component and a p-polarized component to reflect from an interface at a non-normal angle, where the non-normal reflection introduces for each component a phase change upon reflection that is different for each component, and measuring an optical interference signal related to the phase change between the components of the reflected beam.

45 Claims, 10 Drawing Sheets

U.S. PATENT DOCUMENTS

| | | | |
|---|---|---|---|
| 6,987,569 B2 | 1/2006 | Hill | |
| 7,227,645 B2 * | 6/2007 | Cyr | 356/491 |
| 7,233,396 B1 * | 6/2007 | Hall et al. | 356/369 |
| 7,310,152 B2 * | 12/2007 | Carlson | 356/493 |
| 2003/0007156 A1 * | 1/2003 | De Groot et al. | 356/487 |
| 2004/0114152 A1 | 6/2004 | Hill et al. | |
| 2005/0052655 A1 * | 3/2005 | Jones et al. | 356/491 |

OTHER PUBLICATIONS

C. Zanoni, "Differential interferometer arrangements for distance and angle measurements: Principles, advantages and applications", *VDI Berichte* Nr. 749, 93-106 (1989).

B.E.A. Saleh and M.C. Teich, "Fundamentals of Photonics", John Wiley & Sons, Chapter 6, pp. 193-237 (1991).

* cited by examiner

ANGLE INTERFEROMETERS

CROSS-REFERENCE TO RELATED APPLICATIONS

This application claims priority to U.S. Provisional Patent Application No. 60/708,736, entitled "ANGLE INTERFEROMETERS," filed on Aug. 16, 2005, the entire contents of which are incorporated herein by reference.

TECHNICAL FIELD

This invention relates to interferometers, for example, angle-measuring interferometers.

BACKGROUND

This invention relates to interferometry systems, e.g., interferometry systems that measure angular and linear displacements of a measurement object such as a mask stage or a wafer stage in a lithography scanner or stepper system, and also interferometry systems that monitor wavelength and determine intrinsic properties of gases.

Displacement measuring interferometers monitor changes in the position of a measurement object relative to a reference object based on an optical interference signal. The interferometer generates the optical interference signal by overlapping a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change corresponding to a distance change L of $\lambda/(np)$, where L is a round-trip distance change, e.g., the change in distance to and from a stage that includes the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used to convert the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged. In addition to the extrinsic dispersion measurement, the conversion of the optical path length to a physical length requires knowledge of an intrinsic value of the gas. The factor $\Gamma$ is a suitable intrinsic value and is the reciprocal dispersive power of the gas for the wavelengths used in the dispersion interferometry. The factor $\Gamma$ can be measured separately or based on literature values.

Unfortunately, imperfections in the interferometry system may degrade the accuracy of such interferometric measurements. For example, many interferometers include non-linearities such as what are known as "cyclic errors." The cyclic errors can be expressed as contributions to the phase and/or the intensity of the measured interference signal and have a sinusoidal dependence on phase changes associated with changes in optical path length pnL and/or on phase changes associated with other parameters. In particular, there is first harmonic cyclic error in phase that has a sinusoidal dependence on $(2\pi pnL)/\lambda$ and there is second harmonic cyclic error in phase that has a sinusoidal dependence on $2(2\pi pnL)/\lambda$. Higher harmonic cyclic errors may also be present.

There are also "non-cyclic non-linearities" such as those caused by a change in lateral displacement (i.e., "beam shear") between the reference and measurement beam components of an output beam of an interferometer when the wavefronts of the reference and measurement beam components have wavefront errors. This can be explained as follows.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam. Moreover, in many interferometry systems beam shear changes as the position or angular orientation of the measurement object changes. For example, a change in relative beam shear can be introduced by a lateral displacement of a retroreflector measurement object or by a change in the angular orientation of a plane mirror measurement object. Accordingly, a change in the position or angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

In some cases, the change in position or orientation of a measurement object is calculated from measurements of the phase that are made while the lengths or orientations of the measurement and reference beam paths are changing relative to one another, e.g. by translating a stage that includes the measurement object. The relative changes in measurement and reference beam paths may occur as a result of changes in the relative positions and orientations of the measurement and reference objects, or may be due to changes in the disposition of other optical components in the interferometer. For example, optical components in the interferometer may be subject to pitch, yaw and/or roll.

Highly precise metrology demands compensation for changes in the relative directions of the measurement and reference beams, in which information is encoded about distances and/or angles. Without compensation, an interferometer may not provide measurements of suitable precision for applications such as fabrication of semiconductor devices. Angle interferometers are used to determine the relative angular disposition of two beams, such as a measurement beam and a reference beam, and to determine the angle between the beams or provide other information related to the orientation and propagation directions of the beams. Angle interferometers are also used to provide information about changes in beam propagation directions and angles as a function of time.

Interferometers may also include dynamic elements that may be used to control the directions of the measurement and reference beams. These dynamic elements may require feedback signals for their control, and these feedback signals may be provided by measurements of changes in beam direction. For example, in a passive, zero-shear single beam plane mirror interferometer, multiple degrees of freedom of a plane mirror measurement object may be measured using a single measurement beam, and determining changes in the multiple degrees of freedom may include determining changes in the propagation direction of the measurement beam.

SUMMARY

The present invention features apparatus and methods for the measurement of changes in the relative directions of two light beams. In some embodiments, the apparatus and methods may be used to determine relative changes in the angles of propagation of the two beams in a single plane. In some embodiments, the apparatus and methods may be used to determine relative changes in the angles of propagation of the two beams in two orthogonal planes. The sensitivity of the measured relative changes in the angles of propagation may be increased by suitable configuration of the apparatus. Furthermore, the apparatus can be incorporated into an interferometry system to reduce errors associated with pitch, yaw and/or roll of optical components, and to provide feedback signals to dynamic beam control elements.

In general, in one aspect, the invention features a method that includes directing a beam having an s-polarized component and a p-polarized component to reflect from an interface at a non-normal angle, such that the non-normal reflection introduces phase changes upon reflection for each component that differ from one another, and measuring an optical interference signal that is related to the phase change between the components of the reflected beam to determine information about the incident angle of the beam.

Embodiments of the method may include any of the following features.

The information about the incident angle may be determined based on a phase of the optical interference signal.

The beam may reflect from the interface more than once, and the phase of the optical interference signal may be related to a number of times the beam reflects from the interface.

The phase of the optical interference signal may vary depending on a deviation $d\theta_s$ of the s-polarized component and a deviation $d\theta_p$ of the p-polarized component from a nominal beam path. In addition, the phase of the optical interference signal may be proportional to a difference between $d\theta_s$ and $d\theta_p$.

The beam may be directed to the interface at an angle near the angle for total internal reflection.

The beam may experience total internal reflection at the interface, and the beam may reflect from the interface multiple times.

The interface may be a first surface of a prism, and the beam may also reflect from a second surface of the prism at a non-normal angle. The second surface may be substantially parallel to the first surface.

The s- and p-polarized beam components may have different frequencies.

The interface may be a surface of a first optical element and the method may further comprise directing the beam to reflect from a surface of a second optical element at a non-normal angle. The surface of the first optical element may be substantially parallel to the surface of the second optical element. The polarization of the beam may be rotated after the beam exits the first optical element and prior to directing the beam to reflect from the surface of the second optical element. The polarization of the beam may be rotated such that the s-polarized component of the beam at the surface of the first optical element corresponds to the p-polarized component at the surface of the second optical element. The optical path length of the beam in the first optical element may be substantially equal to an optical path length of the beam in the second optical element.

The width of the beam may be reduced in at least one dimension prior to directing the beam to reflect from the interface.

A path of the s-polarized component may deviate from a path of the p-polarized component.

The beam may be derived from an output beam of a displacement measuring interferometer used to monitor the position of a measurement object. The determined information about the incident angle of the beam may be used to reduce errors in the monitored position of the measurement object. The displacement measuring interferometer may be used to monitor the position of a measurement object by directing a measurement beam to reflect from a measurement object and combining the measurement beam with another beam to form the output beam, where either the s-polarized component or the p-polarized component corresponds to the measurement beam.

In general, in another aspect, the invention features a system including an optical element having an interface positioned relative to a beam path so that a beam having an s-polarized component and a p-polarized component and propagating along the path reflects from the interface an a non-normal angle, where the reflection introduces phase changes upon reflection for the s-polarized and p-polarized components that differ from one another according to the incident angle of the beam, and the system also includes a detector positioned to receive the beam after it reflects from the interface, and an electronic processor coupled to the detector and configured to measure an optical interference signal related to the phase change between the components of the reflected beam to determine information about the incident angle of the beam.

Embodiments of the system may include any of the following features.

The optical element may be a prism, and the interface may be a first surface of a prism. The first surface may be oriented so that the beam experiences total internal reflection at the first surface. The prism may additionally include a second surface opposite the first surface, and the beam may reflect from the second surface at a non-normal angle. The second surface may be substantially parallel to the first surface.

The system may additionally include a second optical element having an interface positioned relative to the beam path after the first optical element, where the interface of the second optical element is substantially parallel to the interface of the first optical element. The first and second optical elements may be a pair of prisms, and the prisms may be substantially the same size and shape. Further, a wave plate may be positioned in the path of the beam between the first and second optical elements, the beam may have a wavelength λ, and the wave plate may be a half-wave plate at λ. The wave plate may be configured to transform the polarization of the beam so that the s-polarized component of the beam as the first interface corresponds to the p-polarized component of the beam at the second interface.

An afocal system may be positioned in the path of the beam prior to the optical element, and may be configured to reduce a width of the beam in at least one dimension.

An assembly may be positioned in the path of the beam prior to the optical element, where the assembly may be configured to derive a secondary beam from the beam and to direct the secondary beam to an angle interferometer configured to determine information about the incident angle of the beam in a first plane. The electronic processor coupled to the detector may be configured to determine information about the incident angle of the beam in a second plane orthogonal to the first plane. The angle interferometer may include the optical element.

A light source may be configured to provide the beam where the s-polarized and p-polarized components have different frequencies.

The system may further include an interferometry system configured to monitor a position of a measurement object, where the interferometry system includes an interferometer configured to direct a measurement beam to reflect from the measurement object and to combine the reflected measurement beam with another beam to form an output beam, and the system is further configured to direct a beam related to the output beam along the beam path to reflect from the interface at the non-normal angle. The measurement beam may correspond to either the s-polarized component or the p-polarized component of the beam at the interface. The electronic processor may be further configured to use the determined information about the incident angle of the beam to reduce errors in the monitored position of the measurement object.

Referring to FIG. 8, the system may be configured to monitor the position of a wafer relative to imaged radiation, where the system 801 is included in a lithography system 800 for use in fabricating integrated circuits on a wafer, and the lithography system further includes a stage 810 for supporting the wafer, an illumination system 820 for imaging spatially patterned radiation onto the wafer, and a positioning system 830 for adjusting the position of the stage relative to the imaged radiation. The lithography system may be used in a method for fabricating integrated circuits.

The system may be included in a lithography system for use in fabricating integrated circuits on a wafer, where the system also includes a stage for supporting the wafer and an illumination system including a radiation source, a mask, a positioning system, and a lens assembly, where during operation the source directs radiation through the mask to produce spatially patterned radiation, the positioning system adjusts the position of the mask relative to the radiation from the source, the lens assembly images the spatially patterned radiation onto the wafer, and the interferometry system monitors the position of the mask relative to the radiation from the source. The lithography system may be used in a method for fabricating integrated circuits.

Referring to FIG. 9, the system may be configured to monitor the position of a stage relative to a beam directing assembly, and the system 901 may be included in a beam writing system 900 for use in fabricating a lithography mask, where the beam writing system 900 further includes a source 910 providing a write beam to pattern a substrate, a stage 920 supporting the substrate, a beam directing assembly 930 for delivering the write beam to the substrate, and a positioning system 940 for positioning the stage and beam directing assembly relative to one another.

The system may be used to monitor the position of a stage, and may be included in a lithography method for use in fabricating integrated circuits on a wafer, where the method further includes supporting the wafer on a movable stage, imaging spatially patterned radiation onto the wafer, and adjusting the position of the stage. The method may be used to fabricate integrated circuits.

The system may be used to monitor the position of a mask relative to input radiation, and may be included in a lithography method for use in the fabrication of integrated circuits, the method further including directing input radiation through a mask to produce spatially patterned radiation, positioning the mask relative to the input radiation, and imaging the spatially patterned radiation onto a wafer. The method may be used to fabricate integrated circuits.

The system may be used to monitor the position of a first component of a lithography system relative to a second component of a lithography system, and may be included in a lithography method for fabricating integrated circuits on a wafer that further includes positioning a first component relative to a second component to expose the wafer to spatially patterned radiation. The method may be used to fabricate integrated circuits.

The system may be used to monitor the position of a substrate relative to a write beam, and may be included in a method for fabricating a lithography mask, where the method further includes directing the write beam to the substrate to pattern the substrate, and positioning the substrate relative to the write beam.

Unless otherwise defined, all technical and scientific terms used herein have the same meaning as commonly understood by one of ordinary skill in the art to which this invention belongs.

The details of one or more embodiments of the invention are set forth in the accompanying drawings and the description below. Other features, objects, and advantages of the invention will be apparent from the description and drawings.

DESCRIPTION OF DRAWINGS

Like reference symbols in the various drawings indicate like elements.

DETAILED DESCRIPTION

Optical beams, such as those employed in interferometric measurement systems, include an electromagnetic field that is characterized by a polarization, where the polarization indicates a direction of the electric field vector. The beam polarization includes contributions from two orthogonal polarization components, labeled the s- and p-polarization components. The s-polarization component refers to the component of the polarization vector that is perpendicular to the plane of incidence of the light beam at a surface. The p-polarization component is the component of the polarization vector that is parallel to the plane of incidence of the light beam at the same surface. The phase shift acquired by an electromagnetic field upon reflection from a surface may depend on the angle of incidence the field makes with respect to the surface, and the phase shift may change in response to a change in the angle of incidence. Further, if the s- and p-polarization components of a beam are incident on a surface at different angles of incidence, the components may acquire different phase shifts with respect to one another.

Information regarding the angular differences in the propagation directions of the s and p components may be determined by measuring the phase difference between the components and calculating an angular difference based on the angle-dependent phase shift for a reflecting interface.

Figure 1A:
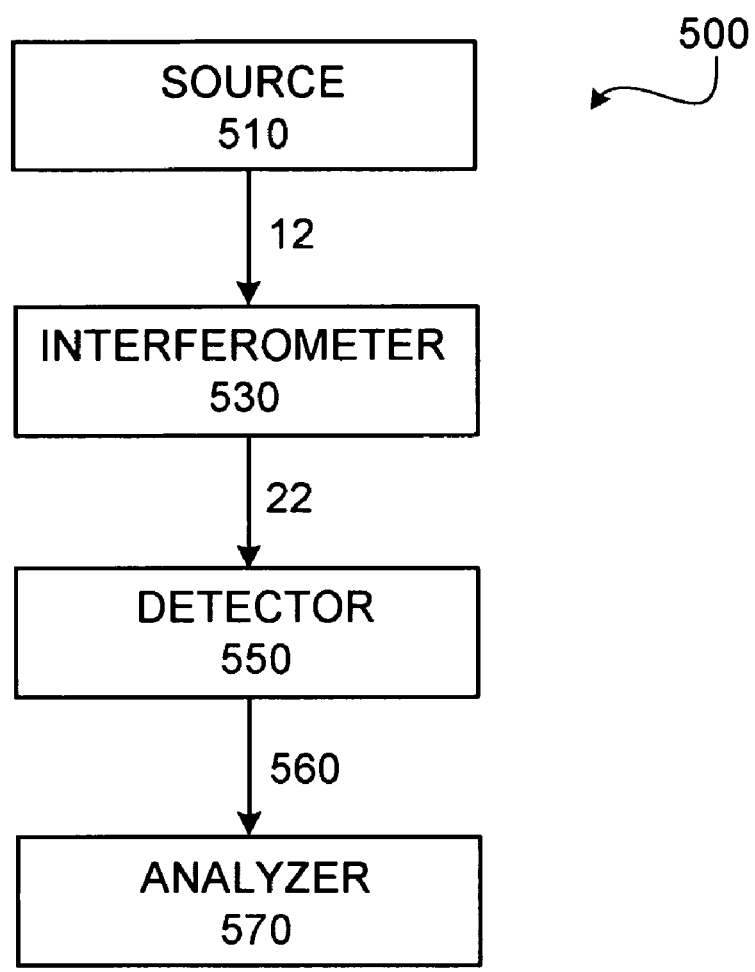
FIG. 1a is a schematic diagram of an angle interferometry system.

Referring to FIG. 1a, an interferometry system 500 includes a source 510, an interferometer 530, a detector 550, and an analyzer 570. A variety of sources 510 may be used, as long as source 510 includes a beam having two orthogonal polarization components. For example, source 510 may be a laser for providing one or more beams 12 to interferometer 530. Alternatively, for example, source 510 may include one or more beams derived from another interferometry system, such as an output beam from a displacement measuring interferometer. Beams derived in this manner may originate from, for example, a laser system. The beam 12 may include polarization components at different wavelengths, or the components may have the same wavelengths.

Interferometer 530 is designed to measure changes in the relative angular directions of the two orthogonal components of beam 12. The interferometer directs the two components to reflect from at least a first interface, where the phase shift induced in each beam component depends on the angle of incidence the component makes with the first interface.

Beam 22 exiting the interferometer is a mixed beam formed by overlapping the two orthogonal components of beam 12. The interference signal generated contains information about the relative difference in optical path length between the orthogonal components, which may be designated as reference and measurement components. In some embodiments, the optical path length of one of the components changes. In other embodiments, the path lengths of both components change. For example, the measurement beam may be derived from a beam that reflects from a measurement object affixed to a wafer stage, and the wafer stage may change position or orientation relative to a reference object.

Beam 22 is detected by detector 550. Detector 550 is sufficiently sensitive that it detects the relative phase between the reference and measurement beam components, and produces an electrical interference signal having a phase that corresponds to the relative phase difference between the reference and measurement components of beam 22. For example, detector 550 may be a quantum photon detector.

Electrical interference signal 560 is transmitted by detector 550 to processor 570. Processor 570 may include an electronic processor and other hardware and software to measure the phase of signal 560 and calculate a relative angular displacement corresponding to the relative change in angular orientation of the measurement and reference beams.

Figure 1B:
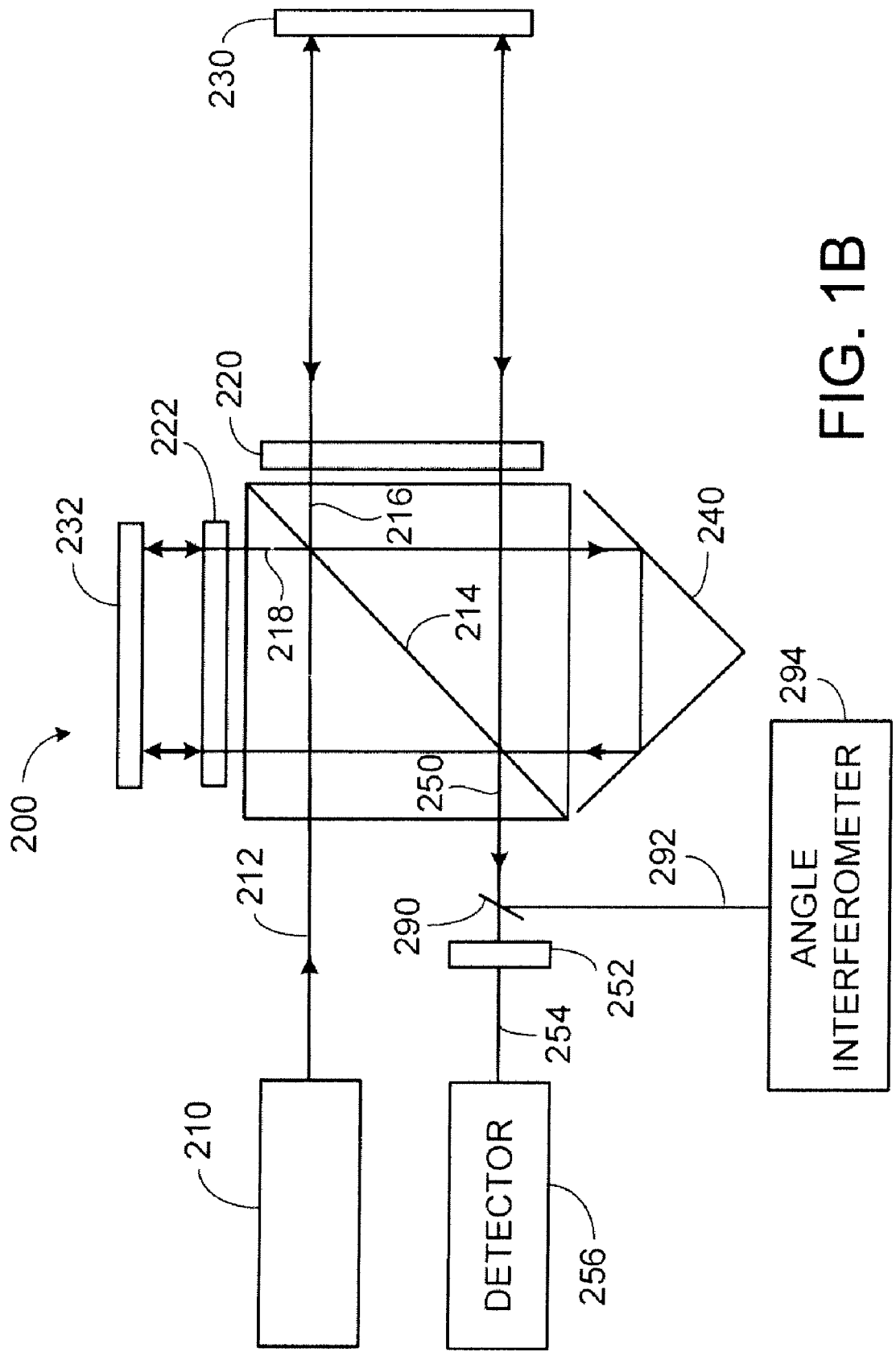
FIG. 1b is a schematic diagram of a distance measuring interferometry system including an angle interferometry system.

Angle interferometers and interferometry systems may be used in combination with other interferometry systems such as displacement measuring interferometry systems. FIG. 1b is a schematic diagram of an embodiment of a displacement measuring interferometer 200 that includes an angle interferometer. The distance measuring interferometer is a high stability plane mirror interferometer (HSPMI). A light source 210 provides an input beam 212 having a heterodyne frequency splitting between orthogonal linear polarization components. The input beam is incident on a polarizing beam splitter 214, which transmits one of the polarization components to define a measurement beam 216 and reflects the other polarization component to define a reference beam 218.

The measurement beam passes through a measurement quarter wave plate 220 and travels along a measurement path to contact a plane mirror measurement object 230, which reflects the measurement beam back through the wave plate 220 to polarizing beam splitter 214. Because of the double pass through wave plate 220, polarizing beam splitter 214 now reflects the measurement beam towards a retroreflector 240, which in turn directs the beam back to the polarizing beam splitter. Thereafter, polarizing beam splitter 214 directs the measurement beam back through wave plate 220 to make a second pass to plane mirror measurement object 230. The measurement object then reflects the measurement beam back through wave plate 220 to polarizing beam splitter 214, which, following the double pass through wave plate 220, now transmits the measurement beam as the measurement beam component of an output beam 250.

The reference beam, on the other hand, passes through a reference quarter wave plate 222 and travels along a reference path to contact a plane mirror reference object 232, which reflects the reference beam back through wave plate 222 to polarizing beam splitter 214. Because of the double pass through wave plate 222, polarizing beam splitter 214 now transmits the reference beam towards retroreflector 240, which in turn directs the beam back to the polarizing beam splitter. Thereafter, polarizing beam splitter 214 directs the reference beam back through wave plate 222 to make a second pass to plane mirror reference object 232. The reference object then reflects the reference beam back through wave plate 222 to polarizing beam splitter 214, which, following the double pass through wave plate 222, now reflects the reference beam as the reference beam component of output beam 250.

A polarizer 252 is positioned to receive output beam 250 and functions as an analyzer that selects a linear polarization that mixes the measurement and reference beam components to produce a mixed beam 254 whose intensity is measured by a detector 256. The intensity measured by the detector includes an interference signal that oscillates at the heterodyne frequency (or the sum of the heterodyne frequency and a Doppler shift if the stage is moving), and the phase of that interference signal indicates the position of the stage.

A beam splitter 290 is positioned in the path of output beam 250, and generates a second beam 292 with polarization components that are similar to those of output beam 250. Beam 292 enters an angle interferometer 294, which measures the relative changes in orientations and/or propagation directions of the two orthogonal components of beam 292 as a function of time. The parameters measured by angle interferometer 294 may be used to adjust the values measured by detector 256, and may additionally be used to adjust mirrors, lasers, or other components of interferometer 200.

In general, beam splitter 290 may alternatively be positioned such that angle interferometer 294 measures relative angular changes in the components of a beam other than output beam 250 as well. For example, beam splitter 290 may be positioned along the path of input beam 212 in order to provide information about the changes in the relative angular orientations of the components of beam 212.

Generally, angle interferometers may be used to monitor variations in beam directions in a variety of interferometers. For example, angle interferometers may be used to monitor beam directions in systems using dynamic interferometers, examples of which are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Other types of interferometers include passive zero shear interferometers, described, for example, in U.S. patent application Ser. No. 10/207,314, entitled "PASSIVE ZERO SHEAR INTERFEROMETERS," filed Jul. 29, 2002, by Henry A. Hill. Further systems include interferometry systems for measuring more than one degree of freedom and/or for reducing beam shear, such as those described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). In some embodiments, angle interferometers are used in systems including dispersion interferometers, such as the two-wavelength dispersion interferometers described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

Figure 1C:
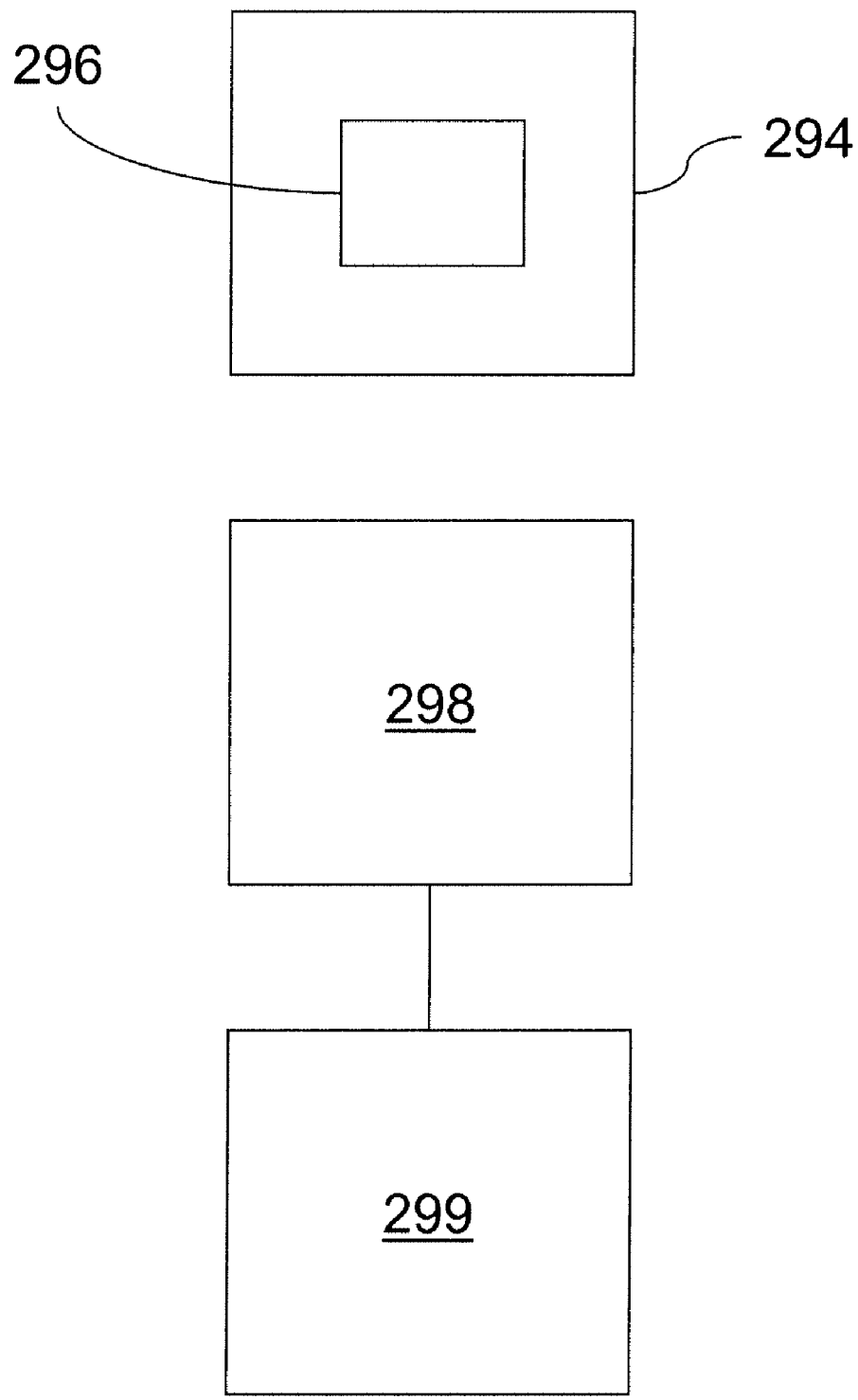
FIG. 1c is a schematic diagram showing an angle interferometer, a detector, and an electronic controller.

Referring to FIG. 1c, in certain embodiments, angle interferometer 294 includes an optical element 296. Angle interferometer 294 is positioned relative to a detector 298, which is coupled to an electronic processor 299.

Figure 2:
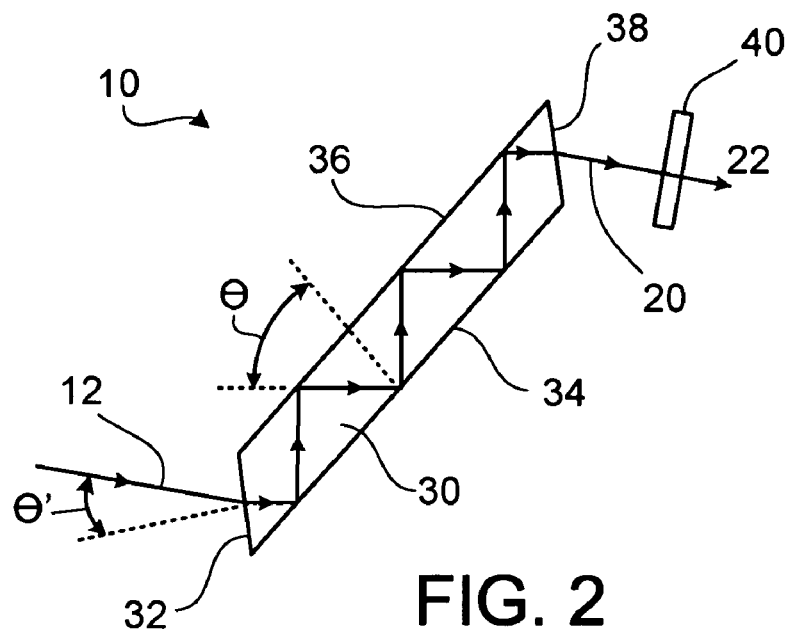
FIG. 2 is a schematic diagram of one embodiment of an interferometer that obtains information about the directions of propagation of two orthogonal beam components in one plane.

FIG. 2 shows an embodiment of an interferometer 10 that obtains information about the directions of propagation of two orthogonal beam components in one plane. Input beam 12 includes two orthogonally polarized beam components, where the plane of polarization of the s component is orthogonal to the plane of FIG. 2, and the plane of polarization of the p component is parallel to the plane of FIG. 2. Input beam 12 is incident upon interface 32 of optical element 30 at a nominal angle of incidence θ'. Optical element 30 includes interfaces 34 and 36 which are nominally parallel, and interfaces 32 and 38 which are nominally parallel. Further, the orientation of element 30 with respect to the direction of input beam 12 is such that the propagation direction of input beam 12 is nominally orthogonal to interface 32 and is similarly orthogonal to interface 38.

Input beam 12 enters element 30 by passing through interface 32 and reflects at least once from interface 34 and from interface 36 before passing through interface 38 and leaving element 30. Optical element 30 may be used to introduce a relative phase shift $\phi_1$ between the s and p components of input beam 12. The magnitude of the phase shift experienced by either beam component on reflection from either interface 34 or 36 is dependent upon the angle of incidence the beam component makes with the interface. The s and p components may acquire different phase shifts if the components are incident upon either interface 34 or 36 at different angles or if the components are incident at the same angle and the phase shift of a beam on reflection from either interface is polarization dependent, resulting in relative phase shift $\phi_1$ that corresponds to the different in the phase shifts experienced by the two components. The relative phase shift may be determined in order to obtain information about the propagation directions of the two beam components.

The phase shifts $\delta_s$ and $\delta_p$ that are introduced at each reflection of the s and p beam components from interfaces 34 and/or 36 are described by equations (6.2-9) and (6.2-11) in *Fundamentals of Photonics* (John Wiley & Sons, 1991) by B. E. A. Saleh and M. C. Teich, the contents of which are incorporated herein by reference. The phase shifts are given by $$\tan\frac{\delta_s}{2} = \frac{(n^2\sin^2\theta_s - 1)^{1/2}}{n\cos\theta_s} \quad (1)$$

$$\tan\frac{\delta_p}{2} = n\frac{(n^2\sin^2\theta_p - 1)^{1/2}}{\cos\theta_p} \quad (2)$$

where $\theta_s$ and $\theta_p$ are the angles of incidence that the s and p beam components make with the surface normals to interfaces 34 and 36, and n is the index of refraction of optical element 30. The angles of incidence of the s and p beam components with respect to interface 32 are represented as $\theta_s'$ and $\theta_p'$.

The s and p beam components may also be designated the reference and measurement beam components, respectively. The sensitivities of the phase shifts $\delta_s$ and $\delta_p$ to changes in $\theta_s$ and $\theta_p$ are described, to first order, by the first derivatives of $\delta_s$ and $\delta_p$ with respect to $\theta_s$ and $\theta_p$ as $$\frac{\partial \delta_s}{\partial \theta_s} = \frac{2n\sin\theta_s}{(n^2\sin^2\theta_s - 1)^{1/2}} \quad (3)$$

$$\frac{\partial \delta_p}{\partial \theta_p} = \left[\frac{1}{\sin^2\theta_p + (n^2\sin^2\theta_p - 1)}\right]\frac{2n\sin\theta_p}{(n^2\sin^2\theta_p - 1)^{1/2}} \quad (4)$$

The two beam components, on entering element 30, each acquire an additional phase delay with every reflection from interface 34 and 36. After exiting element 30 through interface 38, the s component has acquired a total phase delay $\phi_s$ and the p component has acquired a total phase delay $\phi_p$. The relative phase shift $\phi_1$, given by the difference in the total phase delays accumulated by the s and p components from internal reflections within optical element 30, is calculated as $$\varphi_1 = N\left[\left(\frac{\partial \delta_p}{\partial \theta_p}\right)d\theta_p - \left(\frac{\partial \delta_s}{\partial \theta_s}\right)d\theta_s\right] \quad (5)$$

where N is the total number of reflections of the s and p beam components from interfaces 34 and 36.

Output beam 20, on exiting optical element 30, is directed to analyzer 40 which converts beam 20 into a mixed output beam 22 that is detected by a detector such as detector 550 of FIG. 1. Mixed output beam 22 is an optical beam that contains information about the relative phase difference of the s and p components of the beam.

Figure 3:
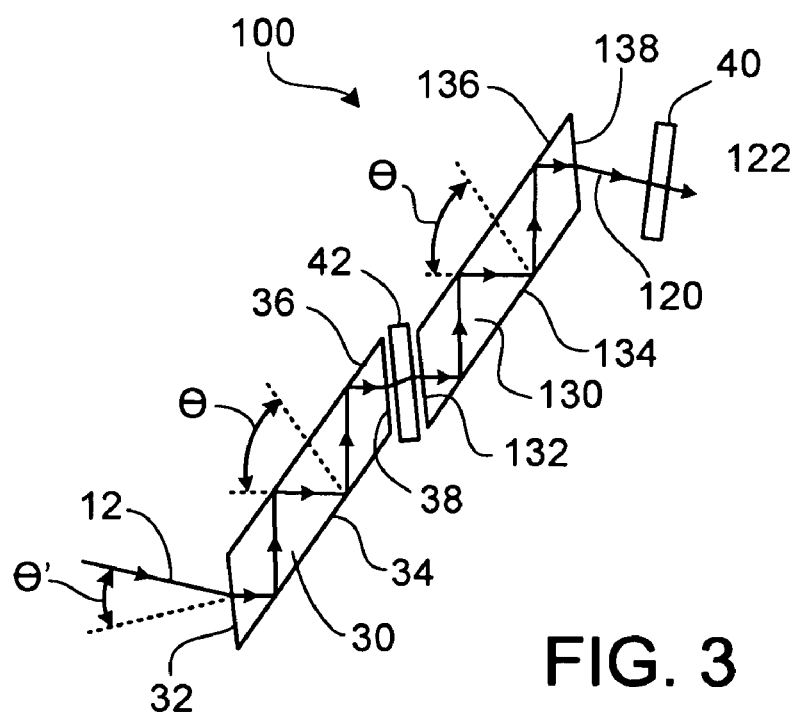
FIG. 3 is a schematic diagram of one embodiment of an interferometer that measures an angular difference in the directions of propagation of two orthogonal beam components in one plane.

FIG. 3 is a schematic diagram of an embodiment of an interferometer 100 that measures an angular difference in the directions of propagation of two orthogonal beam components in one plane. Interferometer 100 includes an element 30 and a second element 130, where element 130 is similar to or the same as element 30. Interferometer 100 also includes an element 42, located between elements 30 and 130, and configured such that it rotates the plane of polarization of an incident waveform by about 90° on passage of the waveform through element 42.

An input beam 12, including two orthogonal beam components designated s and p (or reference and measurement, respectively), is incident on interface 32 of element 30. The components of input beam 12 undergo at least one reflection from interface 34 and at least one reflection from interface 36 before exiting element 30 through interface 38. On passing through element 42, the plane of polarization of each of the beam components is rotated by nominally 90°, such that the rotated p component is polarized in a plane that is oriented similarly to the plane of the s component of input beam 12, and the rotated s component is polarized in a plane that is oriented similarly to the plane of the p component of input beam 12. The two beam components then enter element 130 by passing through interface 132, and each component reflects at least once from interfaces 134 and 136 before exiting element 130 by passing through interface 138.

Output beam 120, which includes the two beam components, is converted by analyzer 40 into a mixed output beam 122 that is detected by, for example, detector 550 (not shown). Mixed output beam 122 includes information about the relative phase difference between the s and p beam components after passage through elements 30, 42, and 130. If each component of input beam 12 reflects a total of N times from interfaces 34 and 36 together, and then a further N times from interfaces 134 and 136 together, then the relative phase shift between the beam components $\phi_2$ is given by $$\varphi_2 = N\left[\left(\frac{\partial \delta_p}{\partial \theta_p}\right) + \left(\frac{\partial \delta_s}{\partial \theta_s}\right)\right](d\theta_p - d\theta_s) \quad (6)$$

where $d\theta_p$ is the change in incidence angle of the p component of input beam 12, and $d\theta_s$ is the change in incidence angle of the s component of input beam 12.

The use of element 42 to rotate the planes of polarization of the input beam components may reduce the sensitivity of the interferometer 100 to rotation of the input beam polarization. On rotation of the polarization of input beam 12, the amplitude of the measured interferometric signal may change, but the null position of the interferometer signal will not change. In general, element 42 may be any element or combination of elements that produce a rotation of the polarization of the components of input beam 12 by about 90°. For example, element 42 may be a half-wave plate that introduces a phase retardation of nominally one-half of one incident wavelength to an input beam component. Alternatively, for example, element 42 may include two reflecting right-angled prisms, where the prisms are oriented such that the normals to the their angled surfaces lie in orthogonal planes. In another alternative embodiment, for example, element 42 may include two angled mirrors, oriented such that their surface normals lie in orthogonal planes.

Figure 4:
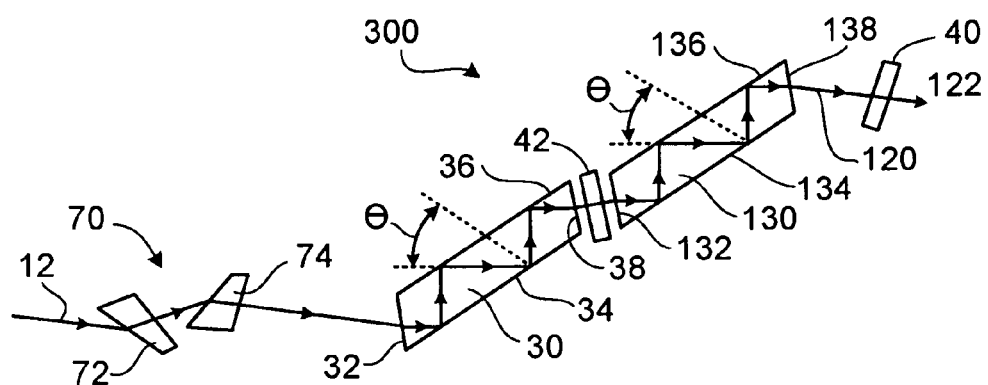
FIG. 4 is a schematic diagram of one embodiment of an interferometer that is similar to the interferometer of FIG. 3, and that further includes an afocal apparatus for reducing the diameter of the orthogonal beam components.

FIG. 4 is a schematic diagram of an embodiment of an interferometer 300 that includes some elements of the interferometer of FIG. 3, and that further includes an afocal apparatus 70 for reducing the widths of the orthogonal beam components in one or more directions. The afocal attachment may be used to increase the sensitivity of the interferometer 300 to changes in direction of the components of input beam 12 by increasing the number of reflections from the interfaces of optical elements 30 and 130 that can be achieved for a given length of elements 30 and 130. The use of an afocal attachment is disclosed, for example, in U.S. patent application Ser. No. 10/207,314 entitled "PASSIVE ZERO SHEAR INTERFEROMETERS", the contents of which are incorporated herein by reference.

In the embodiment shown in FIG. 4, afocal attachment 70 includes two anamorphic prism elements 72 and 74. Prisms 72 and 74 may be used, for example, to reduce the diameter of input beam 12 in one dimension, or smaller in two dimensions. In general, any optical element or system of elements that reduces the diameters of the components of input beam 12 in one or two dimensions may be used. For example, afocal attachment 70 may alternatively include two or more transmissive or reflective lenses.

The reduced diameter of input beam 12, in combination with suitable orientation of elements 30, 42 and 130, may permit a larger number N of reflections of the orthogonal beam components from interfaces 34, 36, 134 and 136 of the elements 30 and 130, relative to the embodiment shown in FIG. 3 where the diameter of input beam 12 is not reduced. Since the magnitude of the relative phase shift between the s and p components depends on N, as shown in equation (5), increasing N increases the relative phase shift between the components. For small differences in $d\theta_p$ and $d\theta_s$, the relative phase shift $\phi_2$ will be larger for larger N. Therefore, the sensitivity of embodiments of an interferometer having an afocal attachment 70 may be increased relative to embodiments that do not have such an attachment.

The sensitivity enhancement that can be achieved may be determined by the ratio of corresponding widths of the beams entering and exiting afocal attachment 70. For example, for a reduction in beam diameter from 5 mm to 1 mm in afocal attachment 70, the sensitivity of interferometer 300 may be enhanced by a factor of 5.

The description of the remaining portions of the present embodiment is the same as for the embodiment of FIG. 3.

In general, the width of the input beam components should be sufficiently small that successive reflections of a particular component from a particular interface do not overlap spatially. Afocal attachment 70 may be used to ensure that this condition is met, by reducing the widths of the input beam components in one or two dimensions. If the beam width is reduced in two dimensions, afocal attachment 70 may include a second set of elements for reducing the width in a second dimension. For example, in addition to the two anamorphic prisms shown in the embodiment of FIG. 4, afocal attachment 70 may include two further anamorphic prisms, positioned and oriented to reduce the beam width in a second dimension. The beam widths may be reduced by different amounts in each of two dimensions.

Generally, the selection of the sizes of elements 30 and 130 and the widths of each input beam component in each of two dimensions may need to include consideration of the effects of diffraction. For example, the spacing of beam spots at each reflecting interface should be larger than the beam spots and, in particular, at the last interface reflection where the size of the beam spot at the last interface reflection is determined in part by the effects of diffraction.

Figure 5:
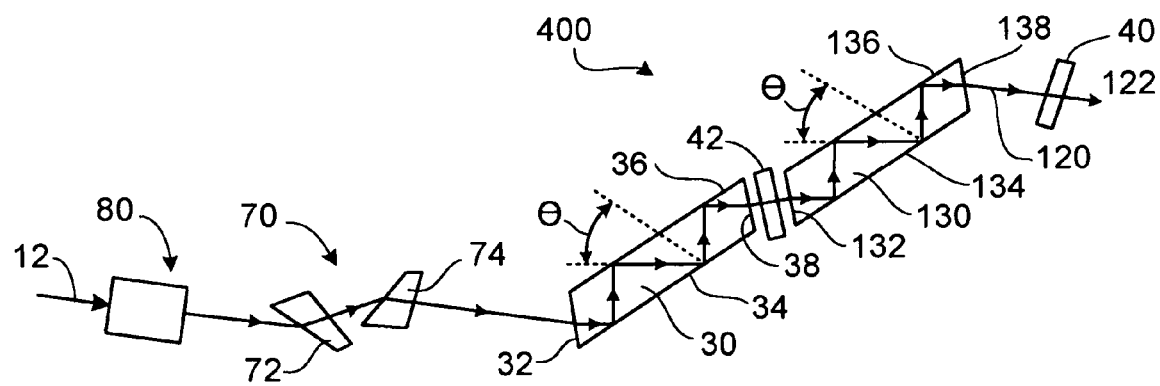
FIG. 5 is a schematic diagram of one embodiment of an interferometer that measures an angular difference in the directions of propagation of two orthogonal beam components in two different planes.

FIG. 5 is a schematic diagram of an embodiment of an interferometer 400 that measures an angular difference in the directions of propagation of two orthogonal beam components in two different planes. In addition to the components of the interferometer of FIG. 4, the embodiment shown in FIG. 5 includes a beam splitting assembly 80 that is positioned such that input beam 12 passes through the beam splitting assembly before passing through the other components of the system. The use of a beam splitting assembly for the measurement of angular propagation differences in two dimensions is disclosed, for example, in U.S. patent application Ser. No. 10/226,591 entitled "DYNAMIC INTERFEROMETER CONTROLLING DIRECTION OF INPUT BEAM", the contents of which are incorporated herein by reference.

On passing through beam splitting assembly 80, input beam 12 is divided into two beams having nominally the same directions of propagation. A first beam includes polarization components that are oriented in the same or nearly the same directions as the polarization components of input beam 12, and a second beam includes polarization components that are oriented such that they are rotated by about 90° relative to the polarization components of input beam 12. The first beam is used to measure a relative change in the direction of propagation of the beam components in a first plane, and the second beam is used to measure a relative change in the direction of propagation of the beam components in a second plane, orthogonal to the first plane. The consequence of the rotation of the polarization components of the second beam with respect to the components of the first beam is that a relative change in the direction of propagation of the components of input beam 12 in the second plane is transformed into a relative change in the direction of propagation of the components of input beam 12 in the first plane.

Beam splitting assembly 80 creates two beams from input beam 12, where the first beam propagates through the remaining components of the interferometry system in FIG. 5 and is analyzed and detected to determine a relative phase shift corresponding to an angular difference in the propagation direction of beam components in a first plane, where the first plane may, for example, be the plane of FIG. 5. The second beam propagates through the remaining components of interferometer 400 following beam splitting assembly 80, and is analyzed and detected to determine a relative phase shift corresponding to an angular difference in the propagation direction of beam components in a second plane orthogonal to the first plane, where the second plane may, for example, be orthogonal to the plane of FIG. 5.

The beam splitting assembly may include any combination of elements suitable for dividing an input beam into first and second beams, and rotating the polarization of the second beam by about 90° with respect to the first beam. For example, beam splitting assembly 80 may include one or more beamsplitters, mirrors, reflective prisms, wave plates, and other elements.

Further, detector 550 (not shown) may be configured to separately detect the two output beams introduced by beam splitting assembly 80, or a second detector may be included, such that each detector detects one of the output beams. Similarly, analyzer 570 (not shown) may be configured to separately measure the phases of two different electrical signals corresponding to the two different output beams, or a second analyzer may be included in embodiments, such that each analyzer measures the phase of one of the electrical signals corresponding to one of the output beams.

The remaining components of FIG. 5 are similar to those of the embodiment shown in FIG. 4.

In general, in the embodiments shown in FIGS. 2-5, input beam 12 may include two orthogonally-polarized beam components s and p, and the beam components may be overlapped to generate a homodyne or a heterodyne signal. The output beam 20 and/or 120 that passes out of optical elements 30 and/or 130 may have a propagation direction that is parallel or nearly parallel to the propagation direction of the input beam to element 30. Alternatively, the input and output beams may not be nearly parallel. For example, in the embodiment of FIG. 2, the angle between beams 12 and 20 may be equal to zero or nearly equal to zero, or may be another angle not equal to zero, such as an angle of 90°.

When input beam 12 includes beam components having the same or nearly the same frequency, and when the net plane of polarization of input beam 12 is oriented at an angle of about 45° with respect to the plane of propagation of input beam 12 (for example, the planes of FIGS. 2-5), the relative phase difference between the two components of input beam 12 after passing through the interferometry system may be measured by a detector using homodyne phase meter techniques. When input beam 12 includes two components having polarizations oriented approximately parallel and perpendicular to the plane of propagation of input beam 12, the relative phase difference between the two components may be measured using homodyne phase meter techniques if the two components have about the same frequency, or using heterodyne phase meter techniques if the two components do not have about the same frequency.

The sensitivity of embodiments of an interferometer may be enhanced by selecting angles $\theta_i$ (i=s,p) such that $$0 < (n \sin \theta_i - 1) << 1 \qquad (7)$$

where $\theta_i$ is the angle of incidence beam component i makes with an interface from which it reflects (for example, interfaces 34 and 36 in the embodiment of FIG. 2) and n is the index of refraction of the element through which the beam components propagate (for example, element 30 in the embodiment of FIG. 2). The sensitivity enhancement may be proportional to $$\frac{1}{[(n\sin\theta_i)^2 - 1]^{1/2}} \quad (8)$$

The condition expressed by equation (7) corresponds, in some cases, to orienting the interfaces such that the angle of incidence of the beam components is nearly equal to the critical angle for total internal reflection.

The sensitivity of an interferometer may also be increased by increasing the number of interfacial reflections of the input beam components. Increasing the number of interfacial reflections may be achieved, for instance, by selecting optical elements such as elements 30 and 130 that have a longer internal optical path length. Alternatively, or in addition, increasing the number of interfacial reflections may be achieved by orienting said elements such that the beam components make a larger number of reflections from the interfaces. Orienting the elements such that the beam components make a larger number of reflections from the interfaces may further include reducing the diameter of the beam components in one or two dimensions by, for example, using an afocal attachment.

Optical elements 30 and 130 may be one of a variety of optical elements that contribute an angle-dependent phase shift to the components of an incident beam upon reflection of the incident beam from an interface of the elements. For example, either or both of elements 30 and 130 may be parallelpipeds, rectangular prisms, or triangular prisms. The elements may have a number of interfaces, and may be positioned to generate a number of reflections from the interfaces by the components of input beam 12 in order to produce a difference in phase shift between the components that may be measured using a detector. The reflecting interfaces may be parallel or nearly parallel, or may not be parallel, such that the optical path of the beam components is complicated. Further, optical elements 30 and 130 may be similar to one another, or may be different.

The components of input beam 12 may reflect from one or more interfaces of optical elements 30 and 130 from the interior of the optical elements or from the exterior of the elements. For example, elements 30 and 130 may be fabricated from a material that is partially transmissive to the components of input beam 12, and the components of input beam 12 may be directed to enter one or both of the elements and propagate therein. Alternatively, element 30 and/or element 130 may include interfaces from which the components of input beam 12 may be directed to reflect from the outside. For example, element 30 and/or element 130 may be prisms of any shape or slabs of material, and the components of input beam 12 may propagate through the air and be directed to reflect from one or more surfaces of the elements.

In the embodiments shown, one element 30 or two elements 30 and 130 were used. However, in general, a number of elements, each including a number of surfaces may be employed to produce a relative phase difference in the components of input beam 12.

Analyzer 40 mixes the components of input beam 12 after the components have passed through optical elements 30 and 130, in order to create a mixed beam 22 or 122 which includes a phase that corresponds to the phase difference between the components of input beam 12. Analyzer 40 may, for example, be a polarizer oriented at an angle such as about 45° with respect to the polarizations of both components. Alternatively, analyzer 40 may be any other combination of elements suitable for mixing the orthogonal components of output beams 20 and 120.

Interferometry systems that include the methods and apparatus described above may increase the accuracy of the interferometer by reducing contributions to interferometric signals that result from relative changes in the angular orientation and propagation direction of reference and measurement beams. As a result, such interferometry systems may provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see for example the *Semiconductor Industry Roadmap*, p. 82 (1997).

Overlay depends directly on the performance, i.e. accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithoraphy: Science and Technology* (Marcel Dekker, Inc., New York, 1998), the contents of which are incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 6A:
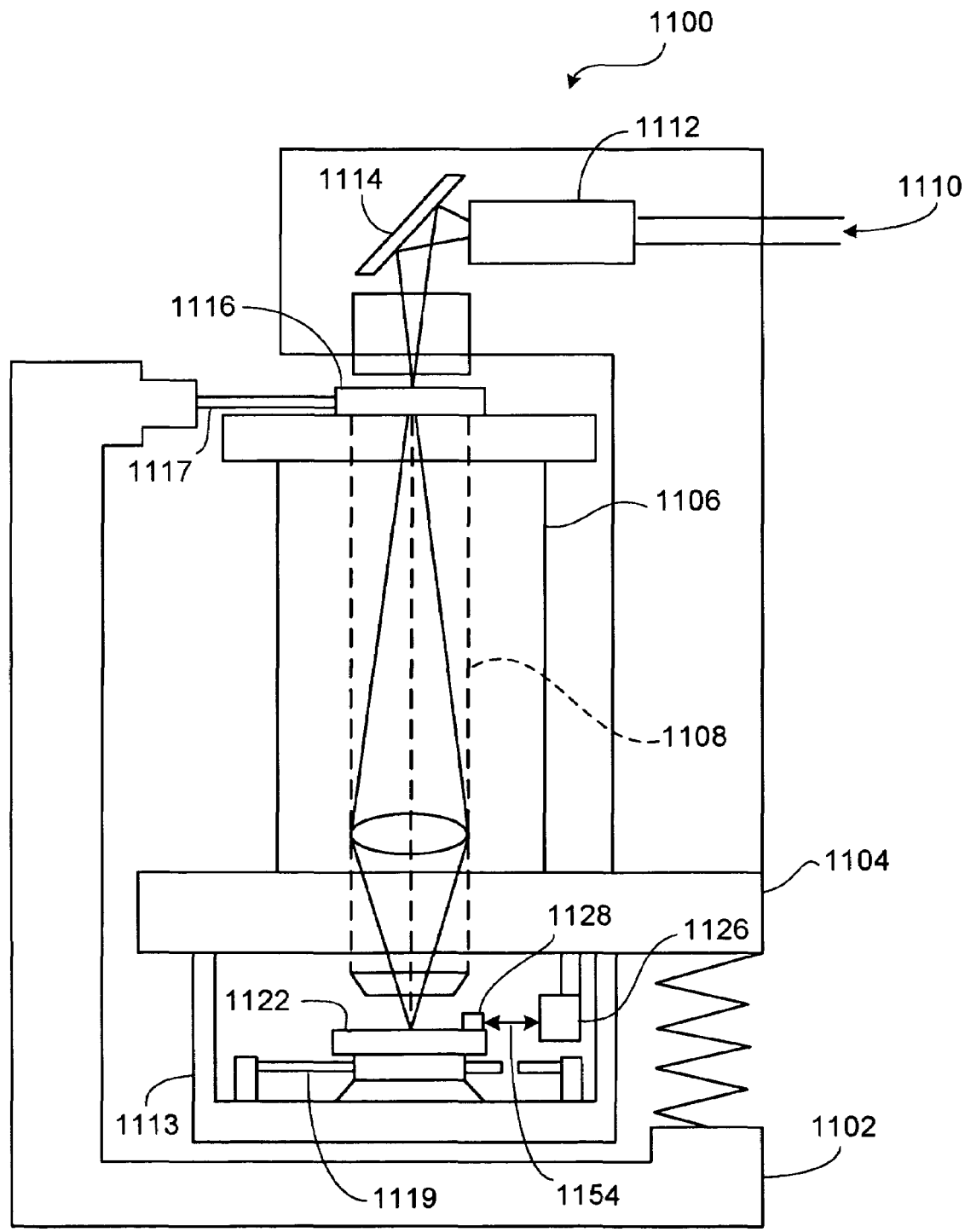
FIG. 6a is a schematic diagram of a lithography system that includes an interferometry system described herein and is used to make integrated circuits.

An example of a lithography scanner 1100 using an interferometry system 1126 is shown in FIG. 6a. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith, *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6B:
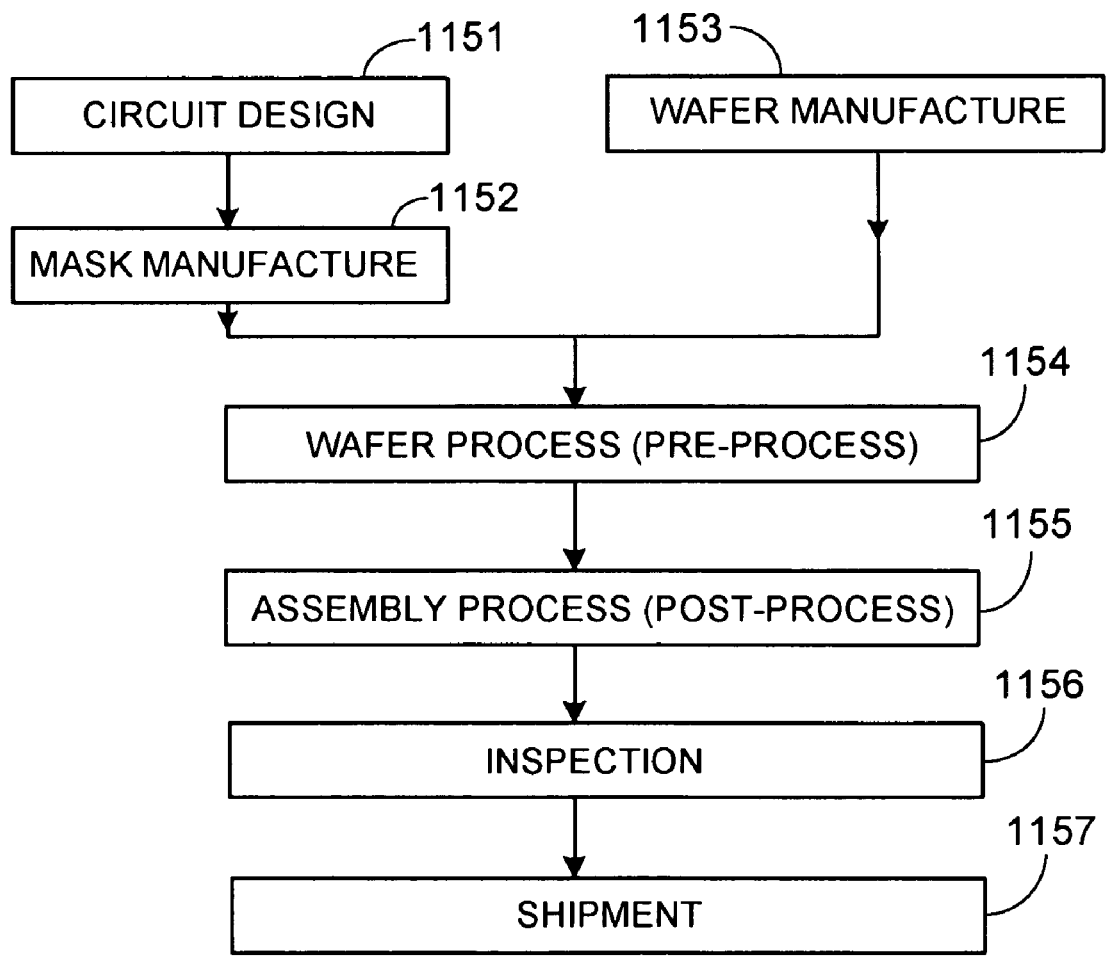
FIGS. 6b-c are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 6b and 6c. FIG. 6b is a flow chart of the sequence of manufacturing a semiconductor device such as a semiconductor chip (e.g. IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 6C:
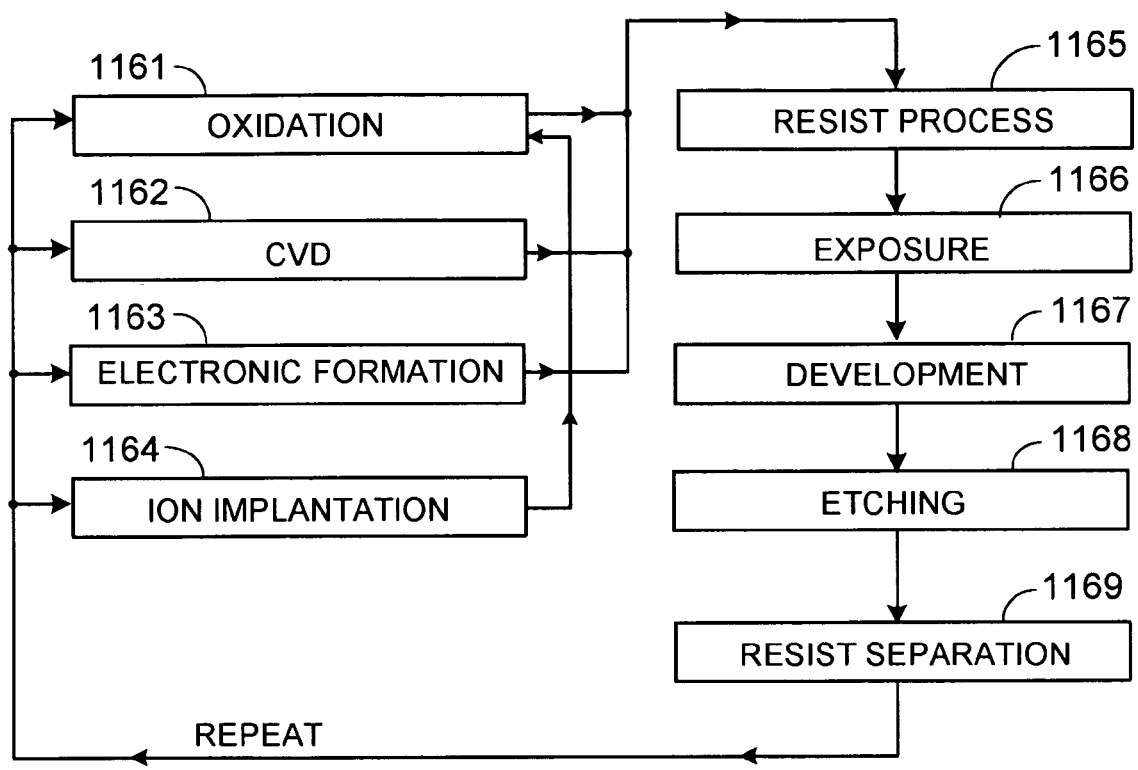

FIG. 6c is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
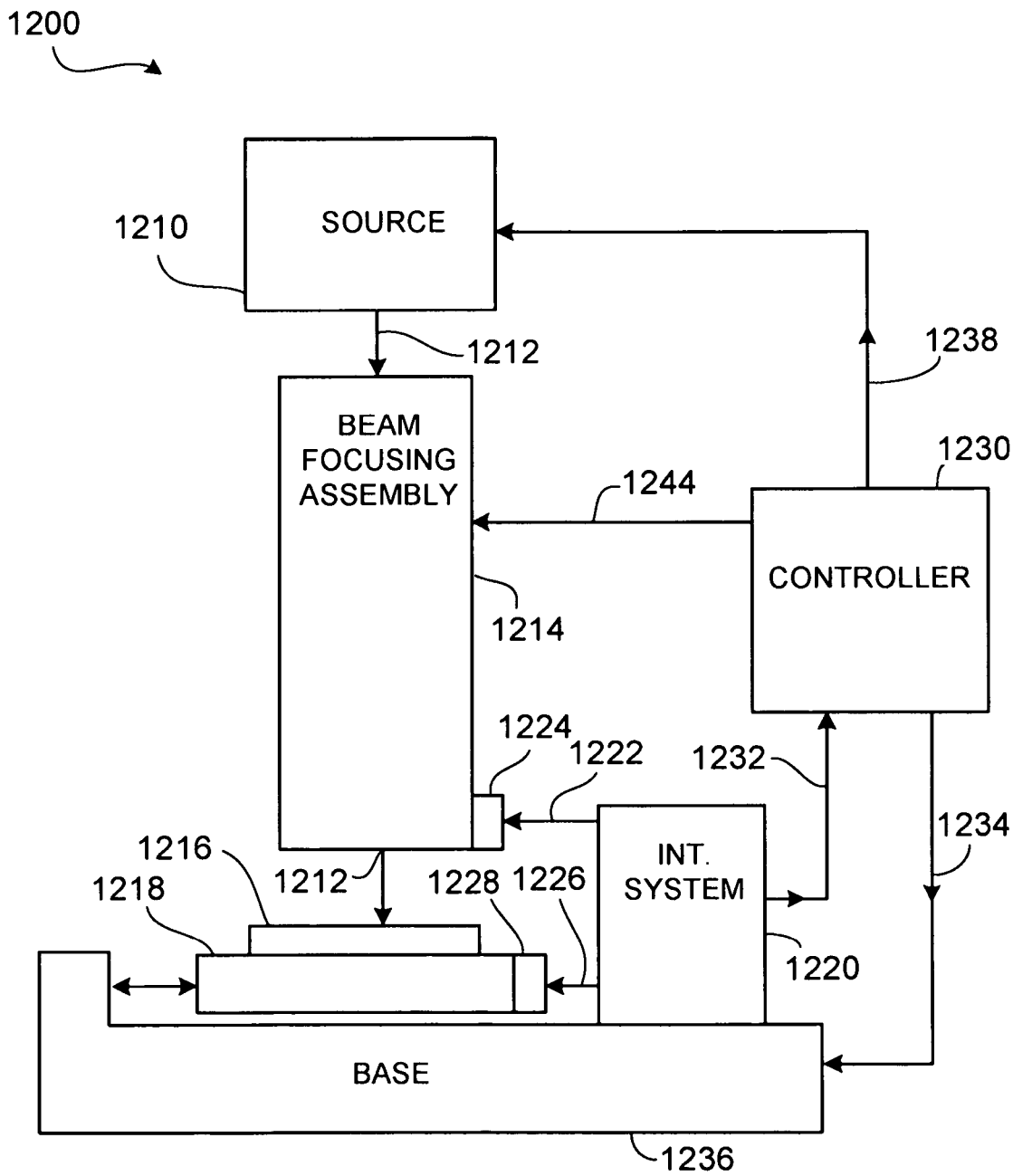
FIG. 7 is a schematic diagram of a beam writing system that includes an interferometry system described herein.
Figure 8:
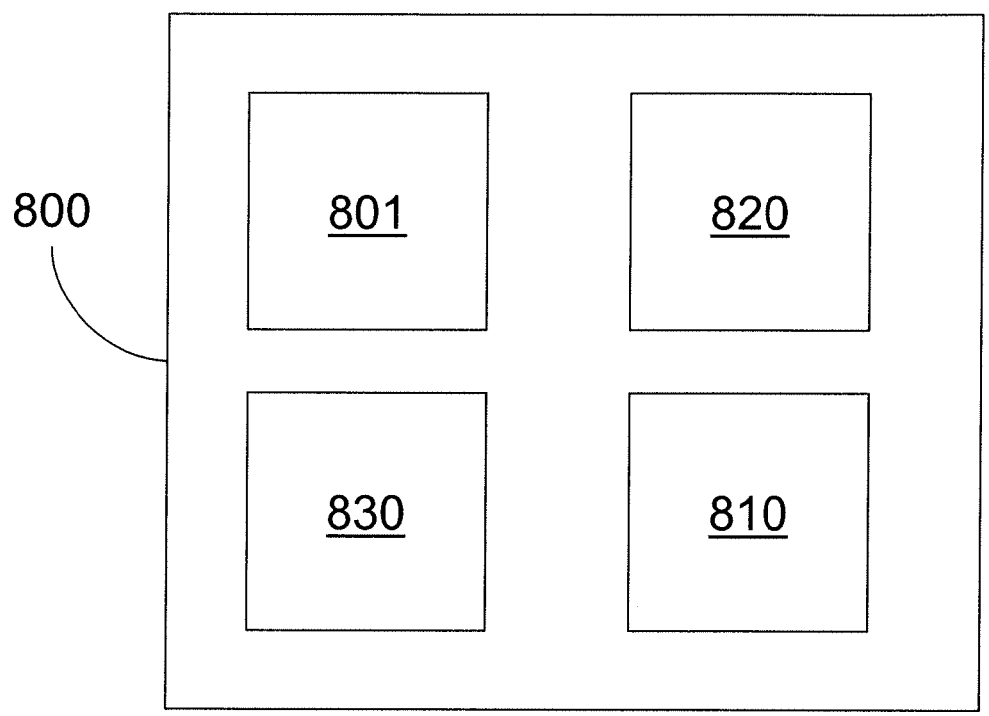
FIG. 8 is a schematic diagram of a lithography system.
Figure 9:
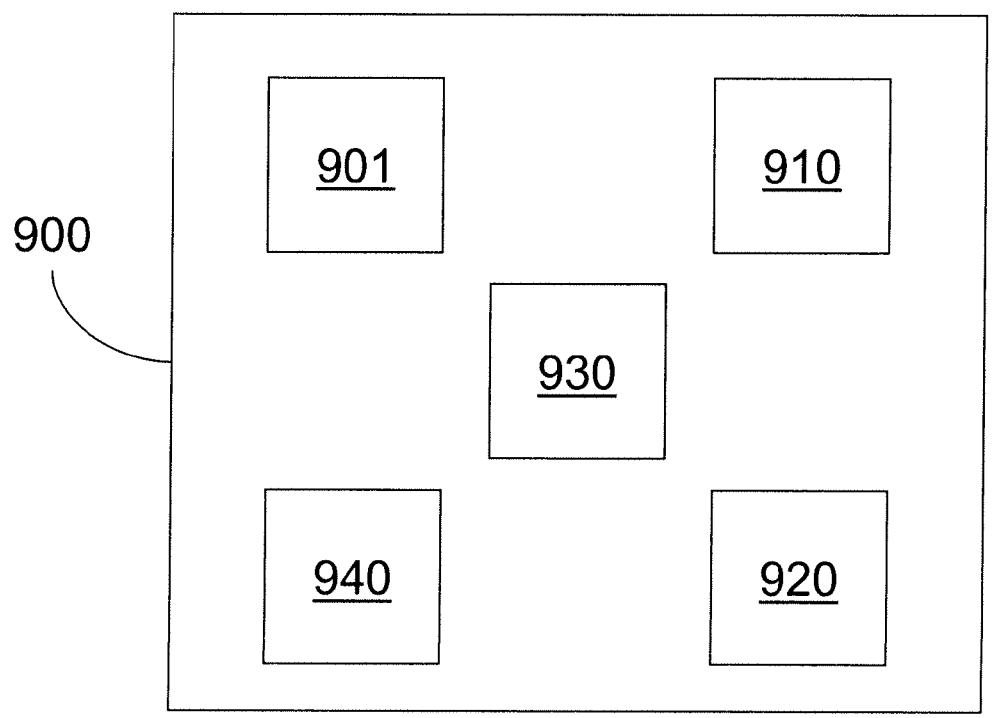
FIG. 9 is a schematic diagram of a beam writing system.

As an example, a schematic of a beam writing system 1200 is shown in FIG. 7. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrupole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method, comprising:
   directing a beam to reflect from an interface of a first optical element at a non-normal angle, the beam having an s-polarized component and a p-polarized component at the interface,
   wherein the non-normal reflection at the interface introduces a phase change upon reflection for the s-polarized component and a phase change upon reflection for the p-polarized component, where the phase changes upon reflection for the s-polarized and p-polarized components differ from one another by an amount that varies depending on the incident angle of the beam at the interface;
   detecting the beam after it has reflected from the interface;
   measuring an optical interference signal from the detected beam, wherein the optical interference signal comprises an interference phase related to the phase changes upon reflection between the s-polarized and p-polarized components of the beam; and
   determining information about the incident angle of the beam at the interface based on the measured optical interference signal.

2. The method of claim 1, wherein the beam reflects from the interface more than once and the interference phase of the optical interference signal is related to a number of times the beam reflects from the interface.

3. The method of claim 1, wherein the interference phase of the optical interference signal varies depending on a deviation, $d\theta_s$, of the s-polarized component and a deviation, $d\theta_p$, of the p-polarized polarized component from a nominal path of the beam.

4. The method of claim 3, wherein the interference phase of the optical interference signal is proportional to a difference between $d\theta_s$ and $d\theta_p$.

5. The method of claim 1, wherein the beam is directed to the interface at an angle near the angle for total internal reflection within the first optical element.

6. The method of claim 1, wherein the beam experiences total internal reflection at the interface.

7. The method of claim 1, wherein the beam reflects from the interface multiple times.

8. The method of claim 1, wherein the first optical element is a prism and the interface is a first surface of the prism.

9. The method of claim 8, wherein the beam reflects from a second surface of the prism at a non-normal angle.

10. The method of claim 9, wherein the second surface is substantially parallel to the first surface.

11. The method of claim 1, wherein the s- and p-polarized beam components have different frequencies.

12. The method of claim 1, wherein after reflecting from the interface the beam is further directed to reflect from a surface of a second optical element at a non-normal angle.

13. The method of claim 12, wherein the interface is substantially parallel to the surface of the second optical element.

14. The method of claim 12, wherein the polarization of the beam is rotated after the beam exits the first optical element prior to reflecting from the surface of the second optical element.

15. The method of claim 14, wherein the polarization of the beam is rotated so that the s-polarized component of the beam at the surface of the first optical element corresponds to the p-polarized component of the beam at the surface of the second optical element.

16. The method of claim 12, wherein an optical path length of the beam in the first optical element is substantially equal to an optical path length of the beam in the second optical element.

17. The method of claim 1, further comprising reducing a width of the beam in at least one dimension prior to directing the beam to reflect from the interface.

18. The method of claim 1, wherein a path of the s-polarized component deviates from a path of the p-polarized component after reflecting from the interface of the first optical element.

19. The method of claim 1, further comprising deriving the beam from an output beam of a displacement measuring interferometer used to monitor the position of a measurement object.

20. The method of claim 19, further comprising using the determined information about the incident angle of the beam to reduce errors in the monitored position of the measurement object by accounting for variations in the direction of the output beam.

21. The method of claim 20, wherein the displacement measuring interferometer monitors the position of the measurement object by directing a measurement beam to reflect from a measurement object and combining the measurement beam with another beam to form the output beam, and wherein either the s-polarized component or the p-polarized component corresponds to the measurement beam; and
wherein directing the beam to reflect from the interface comprises deriving the beam that is directed to reflect from the interface from the output beam.

22. A system, comprising:
an interferometer which during operation produces an output beam comprising information about the position of a measurement object relative to the interferometer;
a first assembly configured to derive a primary beam from the output beam and to direct the primary beam along a beam path;
a first optical element having an interface positioned relative to the beam path so that the primary beam reflects from the interface at a non-normal angle, the primary beam having an s-polarized component and a p-polarized component at the interface,
wherein the non-normal reflection at the interface introduces a phase change upon reflection for the s-polarized component and a phase change upon reflection of the p-polarized component, where the phase changes upon reflection for the s-polarized and p-polarized components differ from one another by an amount that varies depending on the incident angle of the primary beam at the interface;
a detector positioned to receive the primary beam after it reflects from the interface; and
an electronic processor coupled to the detector and configured to measure an optical interference signal related to the phase changes upon reflection between the s-polarized and p-polarized components of the primary beam, and to determine information about the incident angle of the beam at the interface based on the measured optical interference signal.

23. The system of claim 22, wherein the first optical element is a prism and the interface is a first surface of the prism.

24. The system of claim 23, wherein the first surface is oriented so that the primary beam experiences total internal reflection at the first surface.

25. The system of claim 23, wherein the prism comprises a second surface opposite the first surface and the beam reflects from the second surface at a non-normal angle.

26. The system of claim 25, wherein the second surface is substantially parallel to the first surface.

27. The system of claim 22, farther comprising a second optical element having an interface positioned relative to the beam path after the first optical element, wherein the interface of the second optical element is substantially parallel to the interface of the first optical element.

28. The system of claim 27, wherein the first and second optical elements are a pair of prisms.

29. The system of claim 28, wherein the prisms are substantially the same size and shape.

30. The system of claim 27, further comprising a wave plate positioned in the beam between the first and second optical elements.

31. The system of claim 30, wherein the primary beam has a wavelength $\lambda$ and the wave plate is a half wave plate at $\lambda$.

32. The system of claim 30, wherein the wave plate is configured to transform the polarization of the primary beam so that the s-polarized component of the primary beam at the first interface corresponds to the p-polarized component of the primary beam at the second interface.

33. The system of claim 22, further comprising an afocal system positioned in the beam path prior to the first optical element, the afocal system being configured to reduce a width of the primary beam in at least one dimension.

34. The system of claim 22, wherein the electronic processor coupled to the detector is configured to determine information about the incident angle of the primary beam in a first plane.

35. The system of claim 34, further comprising a second assembly positioned in the path of the primary beam prior to the first optical element, the second assembly being configured to derive a secondary beam from the primary beam and to direct the secondary beam to an angle interferometer configured to determine information about the incident angle of the beam in a second plane orthogonal to the first plane.

36. The system of claim 22, further comprising a light source configured to provide an input beam to the interferometer where the s-polarized and p-polarized components of the input beam have different frequencies.

37. The system of claim 22, wherein the measurement beam corresponds to either the s-polarized component or the p-polarized component of the primary beam at the interface.

38. The system of claim 22, wherein the electronic processor is further configured to use the determined information about the incident angle of the primary beam to reduce errors in the monitored position of the measurement object.

39. A lithography system for use in fabricating integrated circuits on a wafer, the system comprising:
- a stage for supporting the wafer;
- an illumination system for imaging spatially patterned radiation onto the wafer;
- a positioning system for adjusting the position of the stage relative to the imaged radiation; and
- the system of claim 22 wherein the electronic processor is configured to monitor the position of the wafer relative to the imaged radiation based on the information in the output beam of the interferometer.

40. A lithography system for use in fabricating integrated circuits on a wafer, the system comprising:
- a stage for supporting the wafer; and
- an illumination system including a radiation source, a mask, a positioning system, a lens assembly, and the system of claim 22,
- wherein during operation the source directs radiation through the mask to produce spatially patterned radiation, the positioning system adjusts the position of the mask relative to the radiation from the source, the lens assembly images the spatially patterned radiation onto the wafer, and the system of claim 22 monitors the position of the mask relative to the radiation from the source based on the information in the output beam of the interferometer.

41. A beam writing system for use in fabricating a lithography mask, the system comprising:
- a source providing a write beam to pattern a substrate;
- a stage supporting the substrate;
- a beam directing assembly for delivering the write beam to the substrate;
- a positioning system for positioning the stage and beam directing assembly relative one another; and
- the system of claim 22 wherein the system is configured to monitor the position of the stage relative to the beam directing assembly based on the information in the output beam of the interferometer.

42. A lithography method for use in fabricating integrated circuits on a wafer, the method comprising:
- supporting the wafer on a moveable stage;
- imaging spatially patterned radiation onto the wafer;
- adjusting the position of the stage; and
- monitoring the position of the stage using a displacement measuring interferometer while reducing errors in the monitored position of the stage using the method of claim 20.

43. A lithography method for use in the fabrication of integrated circuits comprising:
- directing input radiation through a mask to produce spatially patterned radiation; positioning the mask relative to the input radiation;
- monitoring the position of the mask relative to the input radiation using a displacement measuring interferometer while reducing errors in the monitored position of the mask using the method of claim 20; and
- imaging the spatially patterned radiation onto a wafer.

44. A lithography method for fabricating integrated circuits on a wafer comprising:
- positioning a first component of a lithography system relative to a second component of a lithography system to expose the wafer to spatially patterned radiation; and
- monitoring the position of the first component relative to the second component using a displacement measuring interferometer while reducing errors in the monitored position of the first component using the method of claim 20.

45. A method for fabricating a lithography mask, the method comprising:
- directing a write beam to a substrate to pattern the substrate;
- positioning the substrate relative to the write beam; and
- monitoring the position of the substrate relative to the write beam using a displacement measuring interferometer while reducing errors in the monitored position of the substrate using the method of claim 20.

* * * * *

UNITED STATES PATENT AND TRADEMARK OFFICE
CERTIFICATE OF CORRECTION

PATENT NO. : 7,532,330 B2
APPLICATION NO. : 11/504455
DATED : May 12, 2009
INVENTOR(S) : Henry A. Hill It is certified that error appears in the above-identified patent and that said Letters Patent is hereby corrected as shown below:

Title page, column 2 (Other Publications) line 2, delete "dielectri-" and insert --dielectric- --.

Column 20, claim 3, line 52, after "p-polarized" delete "polarized".

Column 20, claim 4, line 56, delete "$d\theta_s$and" and insert --$d\theta_s$ and--.

Column 22, claim 27, line 23, delete "farther" and insert --further--.

Signed and Sealed this

Twenty-eighth Day of July, 2009

JOHN DOLL
*Acting Director of the United States Patent and Trademark Office*